United States Patent [19]

Heinrich et al.

[11] 4,382,587

[45] May 10, 1983

[54] VIBRATION DAMPING ELEMENT

[75] Inventors: Richard Heinrich; Rainer Heinrich, both of Heilbronn, Fed. Rep. of Germany

[73] Assignee: KACO GmbH & Co., Heilbronn, Fed. Rep. of Germany

[21] Appl. No.: 246,032

[22] Filed: Mar. 20, 1981

[30] Foreign Application Priority Data

Mar. 20, 1980 [DE] Fed. Rep. of Germany ....... 3010686

[51] Int. Cl.³ ............................................. F16F 7/00
[52] U.S. Cl. ................................... 267/160; 188/378; 267/141.4
[58] Field of Search .................... 188/378, 379, 382; 267/140.4, 141.1–141.4, 160

[56] References Cited

U.S. PATENT DOCUMENTS 2,018,860 10/1935 Lord ................................. 267/141.4
2,132,840 10/1938 Workman et al. ................. 267/141.4

FOREIGN PATENT DOCUMENTS 2396895 3/1979 France ............................... 188/379

OTHER PUBLICATIONS

H. K. Baumeister, C. C. Kilmer; IBM Technical Disclosure Bulletin; vol. 22, No. 6, Nov. 1979, pp. 2389–2390.

Primary Examiner—Duane A. Reger
Attorney, Agent, or Firm—Becker & Becker, Inc.

[57] ABSTRACT

A vibration damping element, particularly for electrical and/or electronic components, such as printed circuits, integrated circuits or internal connection (IC) bases, relay bases, and the like. The damping element has at least one fastening part, intended for the damping element and arranged on a damping member made of vibration damping material, and also has at least one support surface and holder or support for the components to be damped. The support surface is formed by a portion of the surface of the damping member, on which the structural components to be damped are directly supported. The holder for the structural components to be damped is formed by a part of the damping member itself.

38 Claims, 16 Drawing Figures

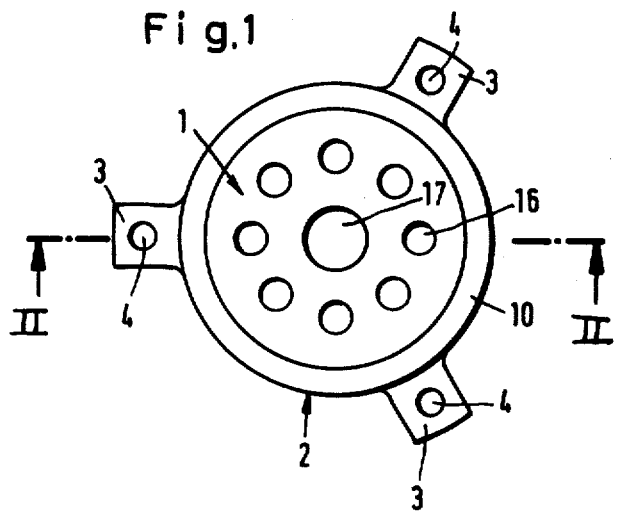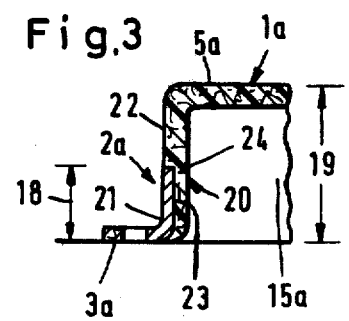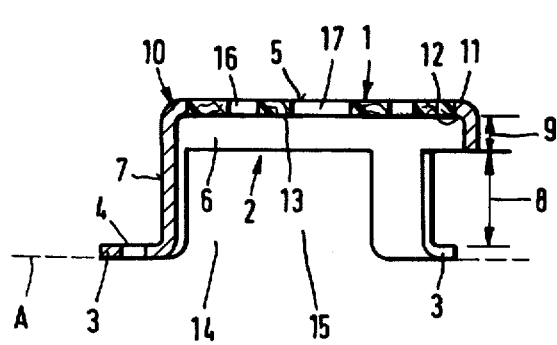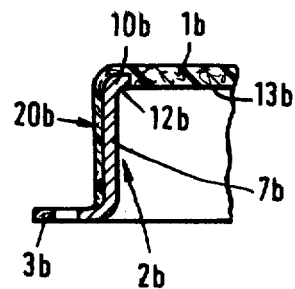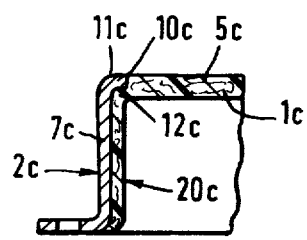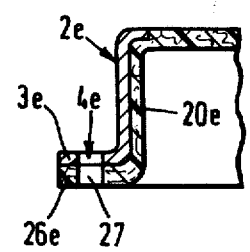

VIBRATION DAMPING ELEMENT

The present invention relates to an oscillation or vibration damping element, particularly for electrical and/or electronic components, such as printed circuits, internal connection or integrated circuit (IC) bases, relay bases, and the like, and has at least one fastening part, for the damping element, which is arranged on a damping member of vibration or oscillation damping material, and at least one support surface and a holder or support for the components to be damped.

A ring or a cap is fastened on the damping member of a known oscillation or vibration damping element of this type; the ring or cap is made of metal, and the components to be damped are fastened thereon. Such a fastening is disadvantageous because, due to the additional metal, part, the damping characteristics of the damping member, which in themselves are good, are reduced again. For example, modern electronic components are more and more used for different applications in the field of motor vehicle technology. These electronic and electrical structural components are especially sensitive to vibrations, blows, and impact because of the many electrical connections inside the structural components. Everywhere where such severe stresses arise with different frequencies and amplitudes, as for example in motor vehicles, these structural components must be vibration-damped in a particularly effective manner since they may otherwise fail already after a short time of operation. With the known vibration damping elements, such highly sensitive structural components can be damped only insufficiently against oscillations or vibrations because the metal part located between the structural components and the damping member inadequately transfers the damping characteristics of the damping member to the structural components to be protected. Additionally, the arrangement of the metal part on the damping member requires additional working steps, so that the production of the oscillation or vibration damping elements is complex and expensive.

It is an object of the present invention to embody a vibration or oscillation damping element of this type in such a way that the vibration damping effected by the damping member can be fully effective upon the structural components to be damped.

This object, and other objects and advantages of the present invention, will appear more clearly from the following specification in connection with the accompanying drawings, in which:

FIG. 1 is a plan view showing a first embodiment of an oscillation or vibration damping element in accordance with the present invention;

FIG. 2 is a cross-sectional view taken along line II—II of FIG. 1;

FIG. 3 is a fragmentary cross-sectional view of another embodiment of a vibration damping element in accordance with the present invention;

FIG. 4 is a fragmentary cross-sectional view of still another embodiment of a vibration damping element in accordance with the present invention;

FIG. 5 is a fragmentary cross-sectional view of another embodiment of a vibration damping element in accordance with the present invention;

FIG. 7 is a fragmentary cross-sectional view of still another embodiment of a vibration damping element in accordance with the present invention;

Figure 6:
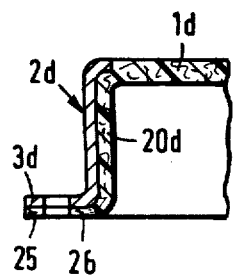
FIG. 6 is a fragmentary cross-sectional view of still another vibration damping element in accordance with the present invention.

The vibration damping element of the present invention is characterized primarily in that the support surface is formed by a portion of the surface of the damping member on which the structural components to be damped are directly supported, and in that the holder for the structural components to be damped is formed by a part of the damping member itself.

With the inventive vibration or oscillation damping element, the electrical and/or electronic structural elements that are highly sensitive to vibrations or oscillations, and which are to be damped, are mounted and held directly on the damping member, i.e. without the interpositioning of any damping-insulating parts. The support surface is formed by a portion of the surface of the damping member, so that the structural components to be damped engage directly upon the damping member. Consequently, the full damping force of the damping member can act upon the structural components, so that an excellent vibration or oscillation damping is attained. The damping member of the inventive vibration or oscillation damping element, however, serves not only for supporting the structural components, but simultaneously serves also for holding or mounting thereof. Since the mounting support is formed by a portion of the damping member itself, also no impairing of the damping effect of the damping member arises in the region of the mounting support, so that the structural components are oscillation damped in an optimum manner. With the inventive vibration or oscillation damping element, the highly sensitive electrical or electronic structural components can be damped in an excellent manner against vibrations or oscillations, so that the vibration or oscillation damping element is particularly suitable for the motor vehicle industry. Since no additional fastening member is necessary for the structural components, the vibration or oscillation damping elements can be produced in a simple and price-advantageous manner. In addition, the structural elements can be easily mounted on the vibration damping elements.

Specific embodiments of the present invention are presented by way of example in the following paragraphs.

At least one installation chamber may be provided in the region below the damping member and in the region between the damping member and the plane of the fastening part, with this installation chamber being accessible from the outside through at least one opening.

The fastening part may be provided on a mounting or holding part with the holding part extending essentially transverse to the plane of the damping member.

The holding part may be a closed ring provided with the opening which leads into the installation chamber and is embodied as a break-through.

The holding part may have an annular section adjacent to the damping member; at least one, preferably three, feet are provided on the annular section, and these feet extend transverse to the damping member and are uniformly distributed over the circumference of the damping member; the free ends of the feet are angled off to form the fastening parts.

The height of the holding part may be smaller than the height of the vibration damping element.

The holding part may be covered by elastic, especially vibration damping, material at least over a part of its height along its inner and/or outer sides.

The holding part may be made of the same material as the damping member, and is preferably integral or unitary therewith; preferably, the feet made of the damping material have greater width than the feet of a holding part made of hard material.

The fastening part, on its engagement side, may be provided with an elastic layer which preferably is made unitary or integral with the elastic material covering the holding part, and preferably is made thicker than the fastening part.

The damping member may be provided with a mantle-shaped annular part which extends over the height of the vibration damping element and transverse to the support surface of the damping member.

The holding part may be embedded in the annular part in such a way that the outer sides of the holding part of the annular part lie in a common plane; the holding part may be covered by the annular part along its inner side; preferably the annular part, in the region above the holding part, is approximately twice as thick as the holding part; and that portion of the annular part covering up the inside of the holding part may have approximately the same thickness as the holding part.

The holding part, at its upper end, may have an edge portion which is angled off in the direction toward the damping member.

The underside of the edge portion may lie in the same plane with the underside of the damping member, and the edge portion may be covered up by the damping member, which preferably merges into the annular part, which covers up the holding part on its outer side.

The upper side of the edge portion may lie in the same plane with the support surface of the damping member, and its underside may be covered up by the damping member, which preferably merges into the annular part overlapping the holding part at its inner side.

The annular part may merge into the layer on the underside of the fastening part. The damping member may have at least one, preferably several, breakthroughs or openings.

The damping member may have different cross sectional thicknesses. The damping member may have a non-flat, preferably wavy cross sectional contour. The fastening part and/or the holding part may be thicker than the damping member.

The holding part may be made of a hard elastomer, and the damping member may be made of a softer elastomer, which are preferably vulcanized together in a single working step.

At least one piece of hard material, such as a metal, may be arranged in the damping member; this piece is spaced from the holding part and has approximately the same thickness as the damping member.

The thickness of the damping member may be increased in its edge region, and the damping member may overlap the edge portion of the holding part at the upper side and underside; preferably, the edge region of the damping member which overlaps the edge portion of the holding part merges into an annular part which overlaps the holding part on both sides and preferably merges into a section covering the fastening part.

The damping member may be provided with an outer edge which is angled-off, preferably at right angles, and is aligned with the feet of the holding part. The structural components may be a projection extending beyond the support surface. The holder may have an approximately mushroom shape. Alternatively, the holder may be U-shaped and have legs or shanks extending parallel to the support surface. The holder may be connected with the damping member by means of a crosspiece provided on the edge of the damping member, with this crosspiece lying in the extension of the circumferential side of the damping member.

The holding part may be a flat ring which is partially introduced into the damping member with spacing below the support surface, preferably approximately at half the height of the damping member.

The damping member, on its support surface, may be provided with at least one slot.

The damping member may comprise at least two different elastic materials, which are arranged in at least two layers.

Referring now to the drawings in detail, the vibration damping element according to FIG. 1 has a damping member 1 made of a vibration damping material. A holding or mounting part 2 is provided for fastening thereof on a housing or other structure; the holding part 2 is provided with three fastening tongues or brackets 3 which are uniformly distributed over its circumference, and in each of which an opening 4 is provided for bolts, or other suitable fasteners. The damping member 1 itself is embodied as a fastening part on which non-illustrated electrical and/or electronic structural elements, structural subgroups, structural groups, assemblies, and the like, are fastened directly, i.e. without interposed metal parts or other similar means. In their installed position, the structural elements engage upon a support surface 5 which is formed by an outer side of the damping member 1.

The holding part 2 has an annular section 6 which extends approximately at right angles to the damping member 1. Three feet 7 are uniformly distributed over the circumference of the section 6. The feet 7 are embodied integrally with the annular section 6, and their free ends are angled off outwardly to form fastening tongues or brackets 3. The height 8 of the feet 7 is greater than the height 9 of the annular section 6 (FIG. 2), preferably being approximately twice as great.

The upper end of the holding part 2 merges into an edge or or rim section 10 which is angled off in the direction toward the damping member 1 and is formed by the upper edge of the annular section 6. The edge section 10 has the same thickness as the damping member 1, so that its upper side 11 and under side 12 are respectively located in the same plane as the support surface 5 and the under side 13 of the damping member 1. Consequently, no step is formed at the transition zone from the damping member 1 to the holding part 2, which would interfere when assembling the structural components. The damping member 1, over its entire thickness, with its outer edge surface, is connected to the end surface of the edge section 10, so that, in spite of the relatively small thickness of the damping member, there is attained a secure connection between the damping member and the holding part. The outer edge of the damping member 1 is protected against damage by the inwardly angled off edge section 10.

The edge section 10 and the fastening bracket 3 are each located approximately at right angles to the feet 7, between each of which an opening 14 is formed, and which delimit or define an installation chamber 15. The installation chamber 15 is located below the damping member 1 and in the region between the damping member and the plane A of the fastening brackets 3. This installation chamber 15 is accessible from the outside by way of the openings 14, so that connecting lines and the like can be introduced through the openings from the outside to the underside of the damping member 1 for connection with structural elements fastened on its top side. The installation chamber 15 is open on that side which is opposite to the damping member 1, so that the connecting lines, prior to the installation of the vibration damping element, can from this side conveniently be connected with the structural elements on the damping member.

The damping member 1 and the holding part 2 each have a circular outline or configuration. The damping member 1 and the holding part 2, however, in accordance with the respective installation conditions, can also have any other suitable configuration, for example, a square, oval, or other outline.

Perforations or openings 16 are provided for increasing the elasticity of the damping member 1, which are uniformly distributed over a circle and have the same diameter. In accordance with the desired elasticity, these openings, however, also can be distributed randomly in the damping member and also can have a non-round cross section. The damping member 1 is provided with a central opening 17 for fastening electrical structural elements, which, for example, can be printed circuits, relays, contactors, switches, and similar components. The central opening 17 lies coaxial to the damping member 1 and has a larger cross section than do the openings 16, which are arranged on a circle likewise located coaxially with respect to the damping member 1 (FIG. 1).

In the embodiment of FIG. 3, the height 18 of the holding part 2a is less than the height 19 of the vibration damping element. The damping member 1a, which is thicker than that of the previous embodiment, is provided with a mantle-shaped ring or annular part 20 extending transverse to the support surface 5a and over the height 19 of the vibration damping element; the annular part 20 is made integral or unitary with the damping member. The holding part 2a is embedded in the annular part 20 in such a way that the outer sides 21 and 22 of the holding part 2a and of the annular part 20 lie in a common plane, and that the holding part is covered up by the annular part at its inner side 23. A very high vibration damping is attained with the mantle-shaped annular part 20, which likewise comprises a vibration-damping material, preferably the same material as that of the damping member 1a. Since additionally the holding part 2a has a smaller height than the vibration damping element, preferably being only approximately half as high, the vibration damping characteristic of the damping member 1a is influenced by the holding part 2a only to an inconsequential extent. Since the outer sides 21, 22 of the holding part and of the annular part lie in a common plane, no obstructing steps are formed. The embedding of the holding part in the annular part 20 additionally makes possible a very secure connection of the holding part with the annular part and the damping member. The overlapping or covering up of the inside of the holding part by the annular part contributes to this secure connection.

In a region above the holding part 2a, the annular part 20 is approximately twice as thick as the holding part, while that portion 24 of the annular part 20 which covers the inner side of the holding part 2a has approximately the same thickness as the holding part. In this way the damping member 1a is connected with the holding part over a relatively stable portion of the annular part 20, while this thicker transitional section leads to an advantageous very high vibration damping. The annular part 20, in the region above the holding part 2a, is approximately as thick as the damping member 1a.

The holding part 2a is embodied having a cylinder mantle shape and is provided with three fastening brackets or tongues 3a uniformly distributed over the circumference of the vibration damping element; these fastening brackets or tongues are angled off outwardly approximately at right angles from the holding part. The holding part 2a is provided with an appropriate number of recesses for the formation of the non-illustrated through-passage openings into the installation chamber 15a; these recesses extend substantially over the entire height of the holding part. Corresponding break-throughs or openings are provided additionally in the annular part 20. The openings in the annular part 20 and in the holding part 2a can be made in the manner of the embodiment of FIGS. 1 and 2, so that the vibration damping element likewise has three feet uniformly distributed over the circumference with these feet in the upper part being formed by the annular part 20, and in the lower part by the holding part and the section 24 of the annular part covering the inner side of the holding part.

The holding part 2b with the embodiment according to FIG. 4 extends substantially over the entire height of the vibration damping element and has the same shape as the holding part 2 according to FIGS. 1 and 2. The holding part is covered externally by the annular part 20b which extends in the region of the feet 7b as far as to the fastening bracket 3b. The annular part 20b is embodied unitary or integral with the damping member 1b, and is made of the same material as that of the damping member. The upper edge section 10b of the holding part 2b lies with its under side 12b in a plane with the under side 13b of the damping member and is covered up by the damping member. The damping member accordingly has a greater thickness than that of the holding part, while the annular part 20b has approximately the same thickness as that of the holding part. As a consequence of the described embodiment, a very secure connection between the holding part and the damping member is attained. Otherwise, the vibration damping element is embodied identically to the embodiment according to FIGS. 1 and 2.

The embodiment of FIG. 5 differs from the embodiment of FIG. 4 only therein that the holding part 2c is covered internally by the annular part 20c. In this case the upper side 11c of the edge section 10c of the holding part 2c lies in a plane with the support surface 5c of the damping member 1c, which covers the edge section 10c along its under side 12c. The annular part 20c extends in the region of the feet 7c over the entire length thereof.

The vibration damping element according to FIG. 6 is similar to that of the embodiment of FIG. 5. The fastening tongue or bracket 3d, on its engagement side 25, is provided with an elastic layer 26, so that the vibration damping element likewise can be fastened in a vibration-damping manner on a housing or the like. Consequently, the vibration-damping characteristics of the element are still further improved. Preferably, the layer 26 extends over the entire engagement side 25 of the particular fastening bracket. The layer 26 merges into the annular part 20d of which it is an integral part. The thickness of the layer 26 is slightly less than the thickness of the fastening bracket. Such layer is already sufficient to attain an effective vibration damping in the region of the fastening of the vibration damping element on a housing or similar structure. In this embodiment, the damping member 1d, the annular part 20d, and the layer 26 are embodied as an integral structure. Otherwise, this embodiment corresponds to the embodiment of FIG. 5.

The vibration damping element of FIG. 7 differs from that of the embodiment of FIG. 6 only in that the layer 26e is thicker than the fastening bracket 3e. Consequently, a considerably higher vibration damping is attained, so that vibrations or oscillations generated from the housing or similar structure can be damped already to a high degree upon their introduction into the vibration damping element. The layer 26e has an opening 27 just like the layer 26, and the opening 27 is aligned with the opening 4e of the fastening bracket 3e.

Figure 8:
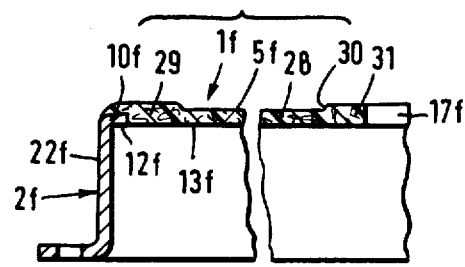
FIG. 8 is a fragmentary cross-sectional view of a further embodiment of a vibration damping element in accordance with the present invention.

The vibration damping element of FIG. 8 is made similar to that of the vibration damping element of FIGS. 1 and 2. Only the damping member 1f is made differently: The damping member 1f has different cross-sectional thicknesses. The vibration damping characteristic can be adapted to the particular necessary conditions by correspondingly changing the cross-sectional thicknesses. The damping member 1f, in this example, has an annular part 28 of smaller cross-sectional thickness, which at a step 30 in the support surface 5f merges with an annular edge region 29 and an annular central region 31 of larger cross-sectional thickness. The under side 13f of the damping member 1f, however, lies in a plane. The edge region 29 and the central region 31 surrounding the central opening 17f have the same cross-sectional thickness. The edge region 29 overlaps the edge section 10f of the holding part 2f, while the under side 12f of the edge section 10f lies in a common plane with the under side 13f of the damping member 1f. That part of the edge region 29 which overlaps the edge section 10f extends as far as to the outer side 22f of the holding part 2f, which is not covered on its outer and inner side. Otherwise the vibration damping element is made identical to that of the embodiment of FIGS. 1 and 2.

Figure 9:
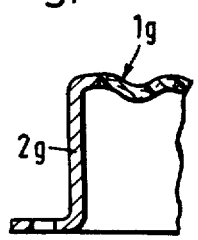
FIG. 9 is a fragmentary cross-sectional view of another embodiment of a vibration damping element in accordance with the present invention.

With the embodiment according to FIG. 9, the damping member 1g has a wavy cross-sectional contour. Consequently, an optimum adaptation of the vibration damping behavior of the damping member to the particular conditions or situations is likewise possible. The damping member 1g is fastened on the holding part 2g in the same manner in which the damping member 1 according to FIGS. 1 and 2 is fastened on the holding part 2.

Figure 10:
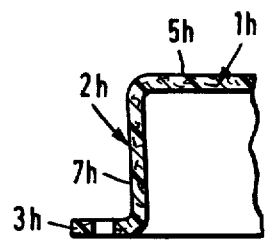
FIG. 10 is a further fragmentary cross-sectional view of a further vibration damping element in accordance with the present invention.

The vibration damping element of FIG. 10 has a holding part 2h which is made of the same material as the damping part 1h. The damping member and the holding part are made unitary or as one piece. Also the fastening bracket 3h is made unitary with the holding part 2h and of the same material, so that the entire vibration damping element consists of a single member made of one and the same material.

In this case, the damping member, the holding part, and the fastening bracket all have the same thickness. An excellent vibration damping is attached with such an embodiment, so that also structural elements which are sensitive to vibrations and shocks can without hesitation be fastened on the support surface 5h of the damping member 1h. Additionally, such a vibration damping element can be manufactured very easily and inexpensively.

In order to obtain the same stiffness as with the holding part made of a hard material, as for example steel, the feet 7h have a greater width than the feet 7 of the holding part 2 made of a hard material.

Figure 11:
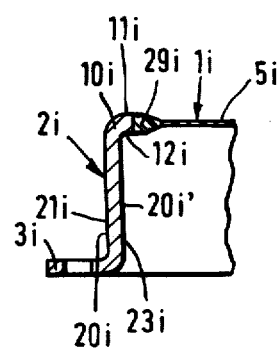
FIG. 11 is a fragmentary cross-sectional view of another vibration damping element in accordance with the present invention.

The damping member 1i of the vibration damping element according to FIG. 11 is considerably thinner than the holding part 2i and/or its fastening bracket or flange 3i. The edge region 29i of the damping member 1i is made thicker and overlaps the edge section 10i of the holding part 2i at its upper and underside 11i, 12i. The edge section 29i, at the outer and inner sides 21i, 23i of the holding part 2i, respectively continues as an annular part 20i, 20i', so that the holding part 2i and its feet 7i are completely covered by the vibration damping material. Also the fastening flange or bracket 3i is completely covered with the vibration-damping material. The vibration damping element consequently is seated already in a vibration-damped manner upon the particular assembly member.

Figure 12:
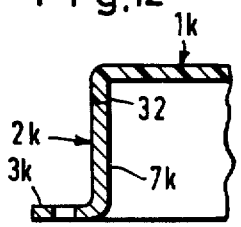
FIG. 12 is another fragmentary cross-sectional view of yet another damping element in accordance with the present invention.

With the embodiment of FIG. 12, the holding part 2k, the fastening bracket or flange 3k, and the damping member 1k have the same thickness. The damping member 1k has an outer edge 32 which is angled off at right angles and lines up or is in alignment with the feet 7k of the holding part 2k. The holding part 2k comprises a hard elastomer, and the damping member 1k comprises a soft elastomer, so that an optimum vibration damping is attained. Otherwise, the vibration damping element is made in the same way as that of the embodiment of FIG. 10.

An advantage of the present invention is that with the embodiments according to FIGS. 1 through 12, it is possible to connect the necessary electrical supply lines or leads very easily to the structural elements fastened directly on the damping member, even when the vibration damping element occupies its assembled position. The supply lines or the like can be conveniently introduced into the installation chamber 15 prior to the installation of the vibration damping element. Thus, a simple and quick assembly is made possible. If the electrical connecting lines have to be exchanged after the installation of the vibration damping element, or if the structural elements fastened on the damping member need to be exchanged or repaired, the connecting lines can be fastened in a simple manner to the structural elements, because the installation chamber 15 is also accessible from the outside by way of the openings 14. Consequently, it is not necessary to remove the entire vibration damping element. Since the installation chamber 15 is provided in the region between the damping member and the plane of the fastening bracket, the connections can be guided on the shortest path to the structural elements fastened on the damping member.

Figure 13:
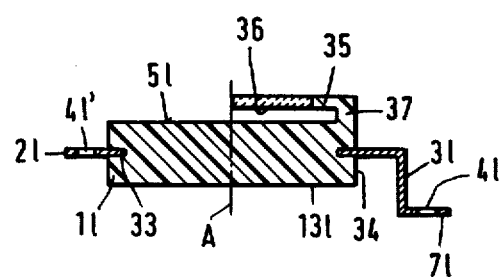
FIG. 13 is an axial section of a further embodiment of a vibration element in accordance with the present invention.

The vibration damping element of FIG. 13 has a damping member 1*l* made of a vibration damping material. For fastening on a housing or the like, this damping member is provided with an holding or mounting part 2*l* which is made of metal or of a nonmetallic, hard material. The holding part 2*l* is located with spacing below the support surface 5*l* of the damping member, which support surface is formed by an outer side of the damping member 1*l*. The annular holding part is embedded with its inner edge 33 in the damping part 1*l*, and projects outwardly beyond the circumferential surface 34 of the damping member.

The damping member 1*l* itself is embodied as a fastening part on which the non-illustrated structural elements are directly fastened, i.e. without the interposition of metal parts or the like. The sensitive electrical and/or electronic structural elements are consequently protected to a great extent against damaging vibrations or oscillations. To make sure that the vibration damping characteristic of the damping member 1*l* is impaired as little as possible by the annular holding part 2*l*, the holding part engages with its inner edge 33 just so far into the damping member that it can support or hold the damping member in a sufficiently secure manner. The radial length of the embedded inner edge 33 of the holding part is considerably smaller than the radial length of that portion of the holding part 2*l* which is located externally of the damping member. Additionally, the holding part is located at such a distance from the support surface 5*l* that it cannot reduce the vibration damping effect in the region of the support surface 5*l*. Advantageously, the holding part is located approximately at half the height of the damping part 1*l*, so that on the one hand it does not reduce the vibration damping effect in the region of the support surface 5*l*, while, on the other hand, below the inner edge 33, there is still sufficient material of the damping member left to assure a secure fastening of the holding part on the damping member.

The holding part part 2*l* can be made planar or, as illustrated in FIG. 13, can also be provided with at least one angled-off fastening bracket or tongue 3*l*, which is provided with at least one opening 4*l* for screws or similar means for fastening the vibration damping element to a housing or the like. In the illustrated embodiment, an opening 4*l* is provided not only in the fastening bracket 3*l*, but also in the holding part itself. The foot 7*l* of the fastening bracket 3*l* is located with spacing below the underside 13*l* of the damping member 1*l*, so that the damping member in the installed position is not in engagement with a housing part or the like. Thus, no undesired vibrations or oscillations are transmitted directly to the damping member.

The holding part 2*l* can have a circular ring-shaped, square, or similar outline. The damping part 1*l* can have a corresponding outline.

A U-shaped fastening element 35 is provided with spacing above the support surface 5*l* for holding or supporting electrical and/or electronic structural elements or groups of elements; the electrical and/or electronic structural element can be fastened between the two legs or shanks of the U-shaped fastening element 35. Expediently, the structural element is, in the region of its fastening area, provided with an enlarged or widened portion with which it reaches under the leg or shank of the fastening element 35 and engages against the underside 36 of the fastening element 35.

The fastening element 35 also can be made in the shape of a plate, and can be provided with an opening for the structural element to be fastened on the damping member.

The fastening element 35 is connected with the damping member 1*l* by way of a transverse web or crosspiece 37. The transverse web 37 is located at the edge of the damping member 1*l* in such a manner that the outer side of the transverse web forms an extension of the peripheral surface 34 of the damping member. Since the transverse web 37 is provided on the edge, substantially the entire support surface 5*l* is available for supporting the structural element held or secured on the fastening element 35. The fastening element 35 extends approximately as far as to the axis A of the damping member for attaining a secure fastening of the structural element on the damping member 1*l*.

The fastening element 35 and the transverse web 37 are made as one piece, so that these parts are made of the same vibration damping material as the damping part 1*l*. Consequently, an especially good vibration damping is assured. The legs or shanks of the fastening element 35 extend parallel to the support surface 5*l* so that the structural elements to be fastened thereto can be held satisfactorily and securely.

Figure 14:
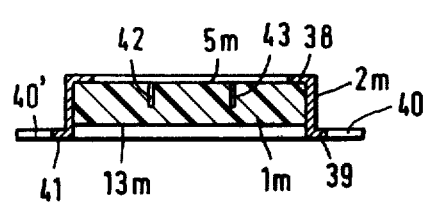
FIG. 14 is an axial section of a further embodiment of a vibration damping element in accordance with the present invention.

With the embodiment of FIG. 14, the holding part 2*m* is embodied as a frame which surrounds the damping member 1*m* along its entire circumference. The damping member is consequently fastened securely on the holding part. The upper edge 38 is angled-off approximately at right angles in the direction toward the axis A of the vibration damping element for the purpose of holding the damping member 1*m* also in the axial direction of the vibration damping element. In place of the circular angled-off edge 38, also individual, radially inwardly projecting tongues can be provided, which likewise assure a sufficient axial holding of the damping member 1*m*.

The lower edge 39 of the holding part 2*m* is angled-off outwardly approximately at right angles in a flange-like manner and forms a foot in which outwardly open slots 40, 40' are provided for fastening screws or similar fastening means. Individual brackets or tongues located with spacing from each other can likewise be provided in place of the circular edge 39, these individual brackets being provided with at least one fastening opening.

The support surface 5*m* of the damping member 1*m* is located with spacing below the upper side of the edge 38, since the holding part 2*m* with its upper angled-off edge 38 thereof overlaps the damping member 1*m*. The underside 13*m* of the damping member, which surface is even or planar just like the support surface 5*m*, the support surface 5*l*, and the underside 13*l* of the embodiment according to FIG. 13, is also spaced from the underside 41 of the angled-off edge 39. Consequently, the damping member 1m does not come into contact with the housing when the vibration damping element is fastened with the lower edge 39 of the holding part 2m on a housing or similar structure, so that no undersired vibrations or oscillations can pass directly into the damping member. In this way, the installation conditions and the desired vibration damping results can be accurately determined, so that the vibration damping element can be adapted exactly to the particular use or application purpose. The underside 13m of the damping member 1m is displaced inwardly approximately by the thickness of the lower angled-off edge 39 of the holding part. The damping member 1m consequently still has a sufficient thickness for assuring the desired high vibration damping effect.

For fastening of the electrical and/or electronic structural elements, depressions or indentations 42, 43 are provided in the support surface 5m into which correspondingly shaped fastening feet of the structural elements can be inserted. The depressions 42, 43 extend approximately over half the height of the damping member 1m, so that the fastening feet of the structural elements are sufficiently anchored therein. In addition, the damping member thus retains a sufficent strength.

The holding part 2m, and therefore also the damping member 1m, can also have a circular, rectangular, or any other suitable contour, as with the previous embodiment. The upper, angled-off edge 38 covers only a very small part of the support surface 5m, so that sufficient space is available for the structural elements to be fastened directly on the support surface. The depressions 42, 43 have sufficient spacing from the holding part 2m so that an excellent vibration damping is attained.

In place of the depressions 42, 43, slots can also be provided in the support surface 5m into which the fastening feet of the structural element are inserted. The slots are elastically spread apart during insertion of the fastening feet, and the feet are held securely directly in the damping member 1m as a consequence of the elastic bracing.

Figure 15:
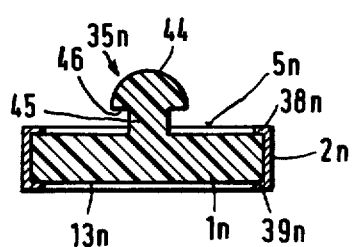
FIG. 15 is an axial cross section of a further embodiment of a vibration damping element in accordance with the present invention.

The vibration damping element of FIG. 15 likewise has a frame as a holding part 2m which completely surrounds the damping member 1n on the circumference thereof. The holding part 2m has angled-off upper and lower edges 38n, 39n which overlap the edge region of the damping member 1n. Consequently, the damping member is secured in both axial directions. The support surface 5n and the underside 13n of the damping member 1n are flat or planar and are set back by the thickness of the angled-off edges 38n, 39n relative to the respective pertaining edge. The damping member 1n is provided with a mushroom-shaped projection 35n which forms the rubber-elastic fastening part of the damping member. The projection 35n is expediently provided centrally on the damping member so that it has sufficient spacing from the holding part 2n on all sides thereof. The projection 35n is provided with an approximately hemispherical head 44 which is connected by a foot 45 with the remaining part of the damping member 1n. The projection 35n is made unitary or integrally with the damping member, i.e. is made of the same material as the damping member.

At the transition area from the head 44 to the foot 45, the diameter of the head is larger than the diameter of the foot, so that at this transition area there is formed a step or an offset portion 46 which overlaps a correspondingly offset portion on the fastening part of the electrical and/or electronic structural element. The step 46 forms a notch or indentation with which the respective structural element can be fastened on the projection 35n. The foot 45 projects beyond the edge 38n of the holding part 2n, so that the structural element can be conveniently fastened on the projection 35n.

Figure 16:
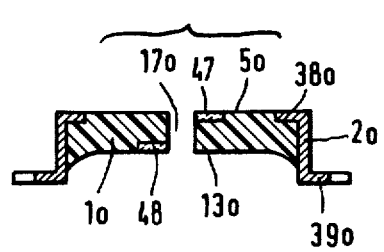
FIG. 16 is an axial cross section of a further embodiment of a vibration damping element in accordance with the present invention.

The holding part 2o of the embodiment of FIG. 16 is identical to the holding part 2m of the embodiment of FIG. 14. However, the damping member 1o is embodied in such a way that its support surface 5o lies in the plane of the upper side of the angled-off edge 38o of the holding part 2o. The underside 13o of the damping member 1o is offset or set back relative to the angled-off lower edge 39o of the holding part, and lies within the frame formed by the holding part. The damping member has a central opening 17o for fastening of the structural elements, which in the installed position are supported directly upon the support surface 5o. Metal pieces 47, 48 are arranged in a floating manner in the damping 1o in the region of the support surface 5o and/or the underside 13o. By means of these metal pieces, the vibration damping characteristic can be adapted in an optimum manner to the respective particular installation situation. In this way, a further improvement of the vibration damping is attainable.

The metal pieces 47, 48 located in the damping member can also be made of a different hard material, as for example ceramic or other similar material, instead of metal. Since these pieces are spaced from the holding part 2o, the desired vibration damping characteristic can be adjusted with these pieces and thus can be improved for each particular installation situation. The pieces 47, 48 are considerably thinner than the damping member 1o, so that they are held in a floating manner in the material of the damping member, i.e., the pieces 47, 48 are elastically supported by the damping member.

In order to be able to fasten the relatively thin damping member sufficiently securely on the holding part, the damping member is made thicker in the edge region.

With all embodiments the holding part can comprise thin steel of a thickness of below 5 mm, for example spring steel. Such a holding part has the necessary strength and stiffness. The holding part can, however, also be made of a hard elastomer, for instance polyurethane. Such a material has vibration-damping characteristics, so that also the holding part itself can contribute to the vibration damping.

It is expedient when the holding part comprises a hard elastomer and the damping member comprises a softer elastomer. These two members can easily be vulcanized together, so that the production of such vibration damping elements can be carried out in a simple and inexpensive manner. In this case, the holding part and the damping member are advantageously vulcanized in a single working step, whereby considerable production-technical advantages result. The damping member is then vulcanized onto the holding part. In this way a very safe, immovable connection is attained between between the damping member and the holding part. The damping member can also be connected with the holding part in a mechanical manner, for example by screwing thereto.

For attaining an optimum vibration damping, the damping member may comprise at least two different damping materials which are attuned to each other for attaining the desired high vibration damping. These different materials can be arranged in at least two layers. Examples of materials which can be used for the damping member include soft elastomers, rubber, etc.

The metal pieces placed in a floating manner can, aside from the embodiments of FIG. 16, also be provided with other embodiments. The metal pieces are spaced from the holding part and can have the same thickness as the damping member.

Assembled structural elements, including printed circuits, integrated circuits or internal connection (IC) bases, relay bases, relays, plug connectors of every type, etc., can be easily fastened to the damping member. With all embodiments, such structural elements can be mounted in a freely floating manner on the damping member. The damping member can also be lined-up in a freely floating member with one or more IC-bases. However, also entire structural elements, such as printed circuits, can be fastened in a freely floating manner on the damping member, for example can be slipped or force-fitted over the projection 35n of FIG. 15.

The damping member can surround the electronic structural element completely or only partially, and can be intimately connected with the electronic structural element, for example by vulcanization. With all embodiments, the feet of the holding part can be directed at an incline outwardly at an obtuse or acute angle relative to the damping member.

The present invention is, of course, in no way restricted to the specific disclosure of the specification and drawings, but also encompasses any modifications within the scope of the appended claims.

What we claim is:

1. A vibration damping element, especially for motor vehicle installation and damping of highly sensitive electrical and electronic components, comprising:
    a damping member of resilient vibration damping material, said damping member being provided with at least one support surface and holding means for directly and immediately supporting said components thereon, said support surface being formed by a completely resilient portion of the surface of said damping member, and said holding means being formed by a resilient portion of said damping member itself; and
    at least one fastening part, which has an engagement side for remote fastening said damping element to a vehicle structure, said at least one fastening part being arranged on said damping member though away from said completely resilient portion.

2. A vibration damping element according to claim 1, which includes at least one installation chamber in the region below said damping member and between said damping member and the plane of said fastening part, said installation chamber being accessible from the outside.

3. A vibration damping element according to claim 2, which includes a holding part in the form of a closed ring interposed between said fastening part and said damping member, said holding part having an opening which is in the form of a break-through and provides said accessibility to said installation chamber from the outside.

4. A vibration damping element according to claim 1, which includes a holding part interposed between said fastening part and said damping member, said fastening part being provided on said holding part, and said holding part being associated with said damping member and extending essentially transverse to the plane of said support surface thereof.

5. A vibration damping element according to claim 4, in which said holding part includes an annular section adjacent said damping member, and at least one foot, which extends essentially transverse to the plane of said support surface of said damping member, one end of each of said feet merging into, and being uniformly distributed over, the circumference of said annular section, the other end of each of said feet being angled off to form respective fastening parts.

6. A vibration damping element according to claim 4, in which the height of said holding part is less than the height of said vibration damping element.

7. A vibration damping element according to claim 4, which includes a covering of elastic material over at least a part of the height of at least one of the inner and outer surfaces of said holding part.

8. A vibration damping element according to claim 4, in which said holding part is made of the same material as said damping member.

9. A vibration damping element according to claim 8, in which said holding part is integral with said damping member.

10. A vibration damping element according to claim 4, in which said engagement side of said fastening part is provided with a covering of elastic material.

11. A vibration damping element according to claim 10, in which said holding part is provided with a covering of elastic material over at least a part of the height of at least one of the inner and outer surfaces thereof, said elastic covering of said engagement side of said fastening part being integral with said elastic covering of said holding part.

12. A vibration damping element according to claim 11, in which said elastic cover of said engagement side of said fastening part is thicker than said fastening part.

13. A vibration damping element according to claim 4, in which said damping member is provided with a mantle-like annular part which extends over the height of said damping element and essentially transverse to the plane of said support surface.

14. A vibration damping element according to claim 13, in which said holding part is embedded in said annular part in such a way that the outer sides of said holding part and of said annular part lie in a common plane, with said annular part covering the inner side of said holding part.

15. A vibration damping element according to claim 14, in which said annular part, in the region above said holding part, is approximately twice as thick as said holding part, and in which that portion of said annular part which covers the inside of said holding part has approximately the same thickness as said holding part.

16. A vibration damping element according to claim 13, in which that portion of said holding part which is associated with said damping member is provided with an edge portion which is angled-off in the direction toward said damping member.

17. A vibration damping element according to claim 16, in which the underside of said edge portion lies in the same plane as the underside of said damping member, said edge portion being covered by said damping member.

18. A vibration damping element according to claim 17, in which said damping member merges into said annular part, which covers the outer side of said holding part.

19. A vibration damping element according to claim 16, in which the upper side of said edge portion lies in the same plane with said support surface of said damping member, with the underside of said edge portion being covered by said damping member.

20. A vibration damping element according to claim 19, in which said damping member merges into said annular part, which overlaps the inner side of said holding part.

21. A vibration damping element according to claim 13, in which the underside of said fastening part is provided with a covering of elastic material, said annular part merging into said elastic covering.

22. A vibration damping element according to claim 1, in which said damping member is provided with at least one opening.

23. A vibration damping element according to claim 1, in which said damping member has a non-uniform cross sectional thickness.

24. A vibration damping element according to claim 1, in which said damping member has a non-flat cross sectional contour.

25. A vibration damping element according to claim 4, in which at least one of said fastening part and said holding part are thicker than said damping member.

26. A vibration damping element according to claim 4, in which said holding part is made of a hard elastomer, and said damping member is made of a softer elastomer.

27. A vibration damping element according to claim 1, which includes at least one piece of hard material arranged in said damping member, said at least one piece being spaced from, and having approximately the same thickness as, said holding member.

28. A vibration damping element according to claim 16, in which said damping member has an edge region of increased thickness, said damping member overlapping the upper and under sides of said edge portion of said holding part.

29. A vibration damping element according to claim 28, in which said edge region of said damping member which overlaps said edge portion of said holding part merges into said annular part which overlaps both sides of said holding part, and in which said fastening part is provided with a covering, said annular part merging into said covering of said fastening part.

30. A vibration damping element according to claim 4, in which said damping member is provided with an angled-off outer edge which is aligned with said holding part.

31. A vibration damping element according to claim 1, in which said holding means for supporting said components is a projection which extends beyond said support surface.

32. A vibration damping element according to claim 31, in which said holding means projection has an approximately mushroom shape.

33. A vibration damping element according to claim 31, in which said holding means projection is U-shaped and has legs which extend parallel to said support surface.

34. A vibration damping element according to claim 33, which includes a cross piece which connects said holding means projection with said damping member, said cross piece being provided on the edge of said damping member and lying in the extension of the circumferential side of said damping member.

35. A vibration damping element according to claim 31, which includes a holding part interposed between said fastening part and said damping member, said holding part being a flat ring which is partially introduced into said damping member at a distance below said support surface thereof.

36. A vibration damping element according to claim 35, in which said holding part is partially introduced into said damping member at approximately one-half the height of said damping member.

37. A vibration damping element according to claim 1, in which said support surface of said damping member is provided with at least one slot.

38. A vibration damping element according to claim 1, in which said damping member comprises at least two different elastic materials which are arranged in at least two layers.

* * * * *